(12) United States Patent
Jaffe

(10) Patent No.: US 6,278,268 B1
(45) Date of Patent: Aug. 21, 2001

(54) METHOD FOR CONTROLLING SCALE PARAMETERS OF AN INSTRUMENT IN RESPONSE TO INPUT TO AN EVENT-GENERATING CONTROL SENSOR

(75) Inventor: Stanley E. Jaffe, Santa Rosa, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/503,007

(22) Filed: Feb. 11, 2000

(51) Int. Cl.$^7$ .............................. G01R 13/20; G06F 15/31
(52) U.S. Cl. ........................ 324/121 R; 324/74; 702/66; 702/67
(58) Field of Search ................. 324/121 R, 74, 324/115, 120, 72.5; 702/66, 67, 68, 69, 71, 73, 74, 75, 76, 89, 107, 116, 117, 120, 121, 122, 141, 183, 198

(56) References Cited

U.S. PATENT DOCUMENTS 4,271,391 * 6/1981 Kmetz ................................ 324/103
4,719,416 * 1/1988 Desautels ....................... 324/121 R
5,155,431 * 10/1992 Holcomb ........................ 324/121 R
5,375,067 * 12/1994 Berchin ................................. 702/66

* cited by examiner

Primary Examiner—Safet Metjahic
Assistant Examiner—Vincent Q. Nguyen
(74) Attorney, Agent, or Firm—John L. Imperato

(57) ABSTRACT

A scale control method provides fine scale control in a measurement instrument and also provides scale control spanning wide adjustment ranges. The method detects the presence of the user input to a control sensor and establishes an acceleration factor for the input based on a rate at which events are generated by the control sensor. The acceleration factor modifies a defined scale step size that has a correspondence to the events generated by the control sensor. The defined scale step size, as modified by the acceleration factor, is added to a prior scale to establish a present scale. The present scale and prior scale are used to select a detent value from a series of detent values and to determine if a detent is applicable. When a detent is applicable, the present scale is set to the selected detent value and control of the scale parameters is then determined by this detent value. When the detent is not applicable scale parameters are adjusted according to the defined step size as modified by the acceleration factor.

18 Claims, 3 Drawing Sheets

METHOD FOR CONTROLLING SCALE PARAMETERS OF AN INSTRUMENT IN RESPONSE TO INPUT TO AN EVENT-GENERATING CONTROL SENSOR

BACKGROUND OF THE INVENTION

Oscilloscopes and other types of measurement instruments have controls for adjusting instrument scale parameters so that measurements can be viewed on display screens of the instruments. Typically, a measurement instrument has high measurement sensitivity and high dynamic range. For example, an oscilloscope may have an amplitude measurement sensitivity of one millivolt (mV) and a dynamic range in excess of ten volts. Accordingly, an instrument's amplitude control must provide fine adjustment of the amplitude scale while also providing adjustment spanning a wide amplitude range. In addition, a measurement instrument typically has high measurement bandwidth. A high-bandwidth oscilloscope may provide picosecond time resolution while spanning a time range in excess of one second. Thus, an instrument's time control must provide fine control of the time scale while also providing adjustment spanning a wide time range.

One approach for achieving scale control in a measurement instrument uses two concentric knobs. A first, inner knob provides fine scale control within a limited range that is defined by detents selected using a second, outer knob. Typically, the detents are in the 1-2-5 sequence. In an oscilloscope, the first three detents selectable using the outer knob may be 1mV, 2mV and 5mV, the second three selectable detents may be 10mV, 20mV and 50mV, and so on. Were the 2mV detent chosen by adjusting the outer knob, for example, the inner knob would provide fine scale control within the 1mV to 2mV amplitude range. Alternatively, were a 5 volt detent chosen by adjusting the outer knob, the inner knob would provide fine scale control within the 2 volt to 5 volt amplitude range. While the dual concentric knobs provide fine scale control and also span a wide adjustment range, they are inconvenient to use since a user of the measurement instrument must alternately rotate each of the two knobs to adjust the instrument's scale parameters.

A single knob approach to adjusting scale parameters of a measurement instrument is provided by a rotary pulse generator, or RPG, included on the instrument's control panel. The RPG generates a predefined number of pulses, or ticks, for each rotation of the knob about a shaft. In order to achieve fine scale control, each tick is mapped to a small scale step size. For example, in an oscilloscope, sufficiently fine scale control is achieved with an RPG that generates thirty ticks per 360-degree rotation of the knob, where each tick is mapped to a scale step size of one mV. While fine scale control is achieved, scale control over a wide adjustment range using a mapping having this step size is inconvenient. A user of the instrument in this example would have to provide in excess of thirty rotations of the knob to achieve scale control over a one volt range. The single knob approach also lacks selectable detents, which if present, would enable precise scale control in large steps within the scale adjustment range, as designated by the sequence of detents.

There is a need for a method of controlling scale parameters in a measurement instrument that provides fine scale control and scale control spanning a wide adjustment range, that is convenient to a user of the instrument.

SUMMARY OF THE INVENTION

A scale control method constructed according to the preferred embodiment of the present invention provides fine scale control in a measurement instrument and also provides scale control spanning wide adjustment ranges. The method is applicable to a variety of instruments having various types of adjustable scale parameters, such as amplitude, phase, frequency, and time scales. The method is responsive to input from a user of the instrument to an input control sensor that generates events, such as pulses or ticks, in response to stimulation of the control sensor by the user. The method detects the presence of the user input to the control sensor and establishes an acceleration factor for the input based on the rate at which events are generated by the control sensor. The acceleration factor modifies a defined scale step size that has a correspondence to the events generated by the control sensor. Fine control of the scale parameter in the instrument is achieved when the acceleration factor is low.

The defined scale step size, as modified by the acceleration factor, is added to a prior scale to provide a present scale. The present scale and prior scale are used to select a detent value from a series of detent values and to determine if a detent is applicable. When the detent is applicable, the present scale is set to the selected detent value and control of the scale parameters is then determined by this detent value. When the detent is not applicable, scale parameters are adjusted according to the defined step size as modified by the acceleration factor.

DETAILED DESCRIPTION OF THE PREFERRED EMBODIMENT

Figure 1:
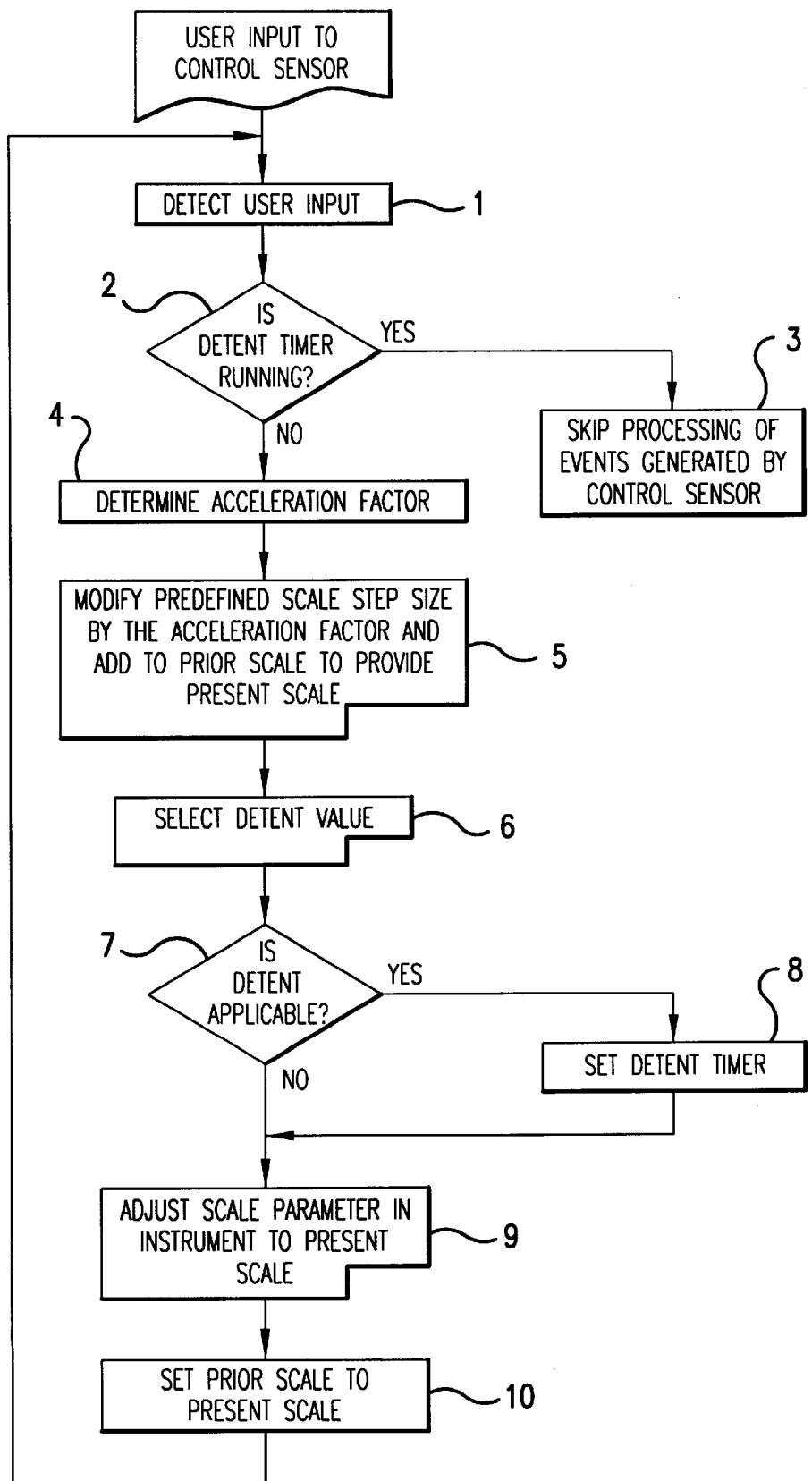
FIG. 1 is a flow diagram of the scale adjustment method constructed according to the preferred embodiment of the present invention.

FIG. 1 is a flow diagram of a scale control method constructed according to the preferred embodiment of the present invention for adjusting scale parameters in a measurement instrument. The method is for use in, or for use with, signal analyzers, oscilloscopes or other types of instruments that have adjustable scale parameters. The method is typically implemented in an instrument's hardware, firmware or embedded software. Alternatively, the method is implemented in a processor or computer external to the instrument.

Examples of scale parameters that are adjustable using the scale control method are amplitude, magnitude, frequency, phase, or time scales. An oscilloscope typically has an amplitude scale and a time scale that are adjustable. A spectrum analyzer typically has a magnitude scale and a frequency scale that are adjustable. Other types of measurement instruments may have additional scale parameters that are also adjustable. The scale control method is applicable to each type of adjustable scale parameter within an instrument.

The scale control method of FIG. 1 is responsive to an input from a user of the instrument that is applied to an event-generating sensor, such as a rotatory pulse generator (RPG), pressure sensing pad or other type of input control sensor associated with the instrument. In a typical measurement instrument, the input control sensor is included on the instrument's control panel, but the type and location of the input control sensor are not exclusive to the operation and use of the method shown in FIG. 1.

For the purpose of illustrating the scale control method, the input control sensor is designated to be an RPG. The events generated by the RPG are pulses, or ticks, that are produced as the knob of the RPG is rotated about a shaft by a user of the instrument. In step 1 of the flow diagram, the presence of an input from the user is detected based on the occurrence or non-occurrence of events generated by the input control sensor. If a detent timer is running, as determined in step 2 of the flow diagram, while events are being generated by the input control sensor, the generated events are not processed to control scale parameters of the measurement instrument (step 3). Step 1 through step 3 are repeated until a user input is detected while the detent timer is not running, as determined in step 2.

When step 2 indicates that the detent timer is not running, events generated by the input control sensor are further processed in step 4 through step 10 to control scale parameters of the measurement instrument.

Figure 2A:
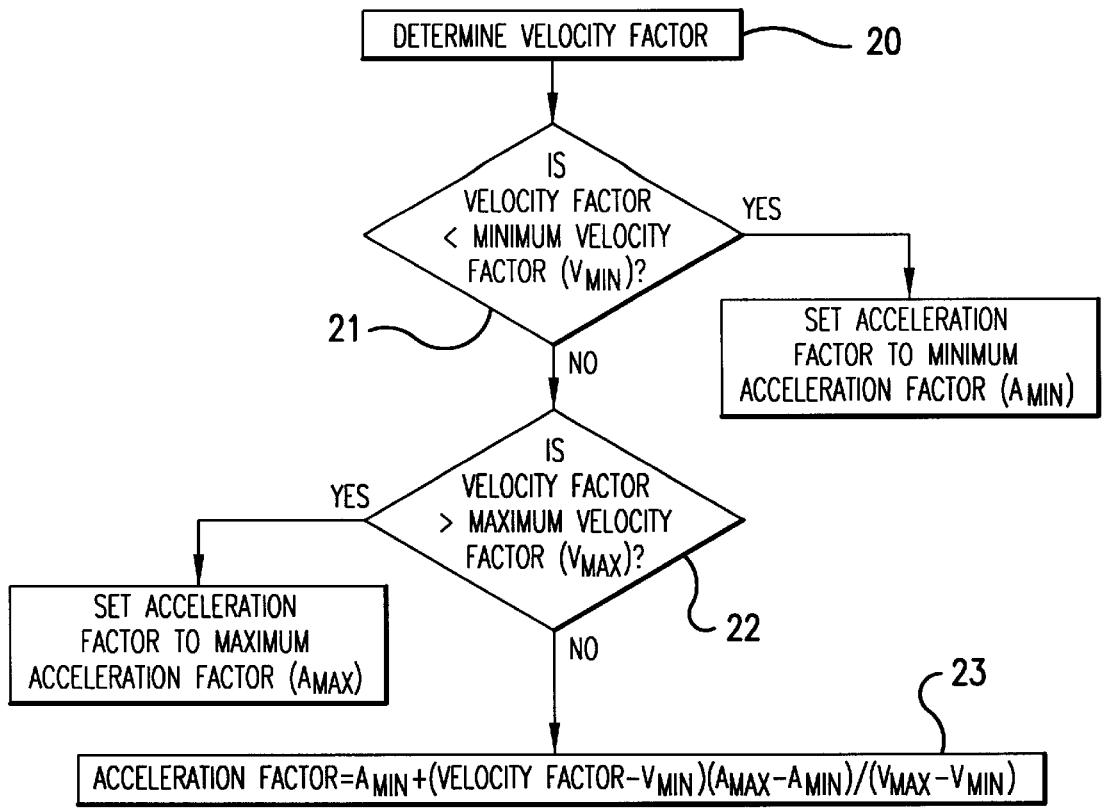
FIG. 2A and FIG. 2B are detailed views of a first portion of the flow diagram of FIG. 1.

In step 4, an acceleration factor for the user input to the input control sensor is determined based on the events generated by the sensor. FIG. 2A shows a detailed view of step 4. In step 20 of FIG. 2A, a velocity factor is determined based on the number of events generated by the input control sensor per unit of time. For an RPG, the velocity factor is the number of ticks, or pulses, that are generated within a designated time interval, such as the number of ticks per second. This velocity factor corresponds to the speed at which the knob of the RPG is rotated.

In step 21 of FIG. 2A, the velocity factor, as determined in step 20, is compared to a designated minimum velocity factor $V_{MIN}$. If the velocity factor is less than the minimum velocity factor $V_{MIN}$, the acceleration factor is set to a minimum acceleration factor $A_{MIN}$, such as one. In step 22, the velocity factor, as determined in step 20, is compared to a designated maximum velocity factor $V_{MAX}$. If the velocity factor is greater than the maximum velocity factor $V_{MAX}$, the acceleration factor is set to a maximum acceleration factor $A_{MAX}$. In step 23, under the condition that the velocity factor is at least as great as the minimum velocity factor $V_{MIN}$ and the velocity factor does not exceed the maximum velocity factor $V_{MAX}$, the acceleration factor is determined according to the following relationship:

$$\text{Acceleration Factor} = A_{MIN} + (\text{Velocity Factor} - V_{MIN})(A_{MAX} - A_{MIN})/(V_{MAX} - V_{MIN})$$

where $A_{MIN}$ is the minimum acceleration factor, $A_{MAX}$ is the maximum acceleration factor, $V_{MIN}$ is the minimum velocity factor, and $V_{MAX}$ is the maximum velocity factor.

Figure 2B:
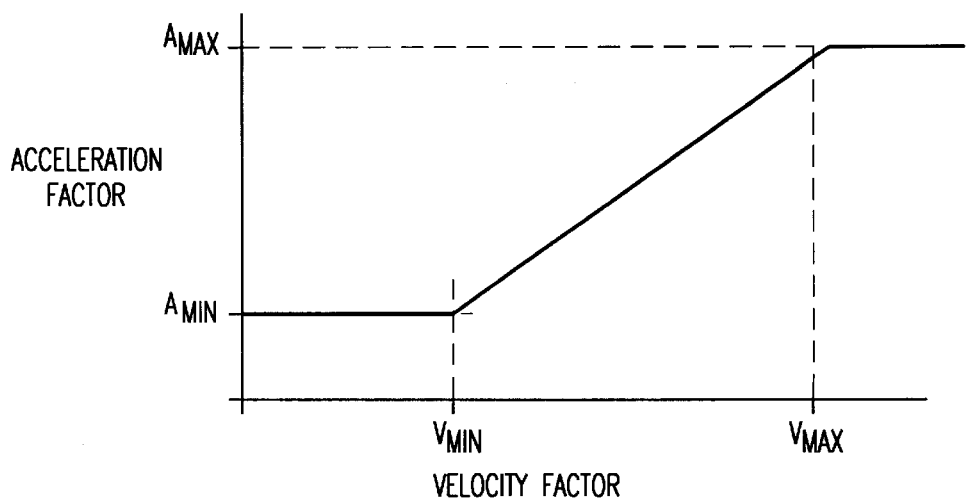

FIG. 2B shows the relationship between the velocity factor and the acceleration factor as established in FIG. 2A. According to FIG. 2A and FIG. 2B, the acceleration factor is linearly related to the velocity factor when the velocity factor is between the minimum velocity factor $V_{MIN}$ and the maximum velocity factor $V_{MAX}$. Other monotonic relationships between the velocity factor and the acceleration factor are alternatively used to establish the acceleration factor from the velocity factor.

Once the acceleration factor is determined in step 4 of the flow diagram of FIG. 1, the acceleration factor is then applied to a predefined scale step size to modify that predefined scale step size so that convenient control of the instrument scale parameter is provided in step 5 through step 10.

The predefined scale step size is particular to the scale parameter of the measurement instrument that is being controlled in response to the user input to the input control sensor. In an oscilloscope, for example, a predefined scale step size of 1mV is particular to the control of the instrument's amplitude scale parameter and a predefined scale step size of one picosecond is particular to the control of the instrument's time scale parameter. In addition to being particular to the scale parameter of the measurement instrument that is being controlled, the predefined step size is defined according to the resolution of the fine scale control for that scale parameter so that when the applied acceleration factor is the minimum acceleration factor, fine scale control of the scale parameter is enabled. In an oscilloscope, fine scale control of the amplitude scale in a 1mV step size is typical. The step size and minimum acceleration factor are designated so that control of the amplitude scale in these 1mV steps is achieved when the minimum acceleration factor $A_{MIN}$ is applied to the predefined step size. A predefined amplitude scale step size of 1mV and a minimum acceleration factor $A_{MIN}$ of one would achieve fine scale control of the amplitude scale in the oscilloscope. The scale step size is assigned a negative polarity when the user input to the input control sensor designates an decreasing scale adjustment. The at scale step size is assigned a positive polarity when the user input to the input control sensor designates an increasing scale adjustment. When clockwise rotation of the knob of an RPG designates an increasing scale adjustment, for example, a positive polarity is assigned to the scale step size. A counter-clockwise rotation of the knob would then designate a decreasing scale adjustment and a negative polarity is assigned to the scale step size.

Under the condition that the acceleration factor applied to the predefined step size exceeds the minimum acceleration factor $A_{MIN}$, control of the instrument's scale parameters is provided in steps, or scale increments, that are larger than the predefined scale step size. The acceleration factor determined in step 4 is sufficiently large to control the particular scale parameter of the instrument in step sizes that exceed the predefined step size so that convenient control of scale parameters spanning a wide adjustment range is enabled. However, the acceleration factor is not large enough to make the scale parameter overly sensitive to inputs to the control sensor from the user of the instrument when the acceleration factor is the maximum acceleration factor $A_{MAX}$.

In step 5, the predefined scale step size for the particular scale parameter being controlled is modified by the acceleration factor by multiplying the predefined scale step size by the acceleration factor. This product is then added to a prior scale to provide a present scale. The prior scale and the present scale are then used to select a detent value from a series of detent values in step 6 and to adjust the instrument scale parameter in step 9.

Figure 2C:
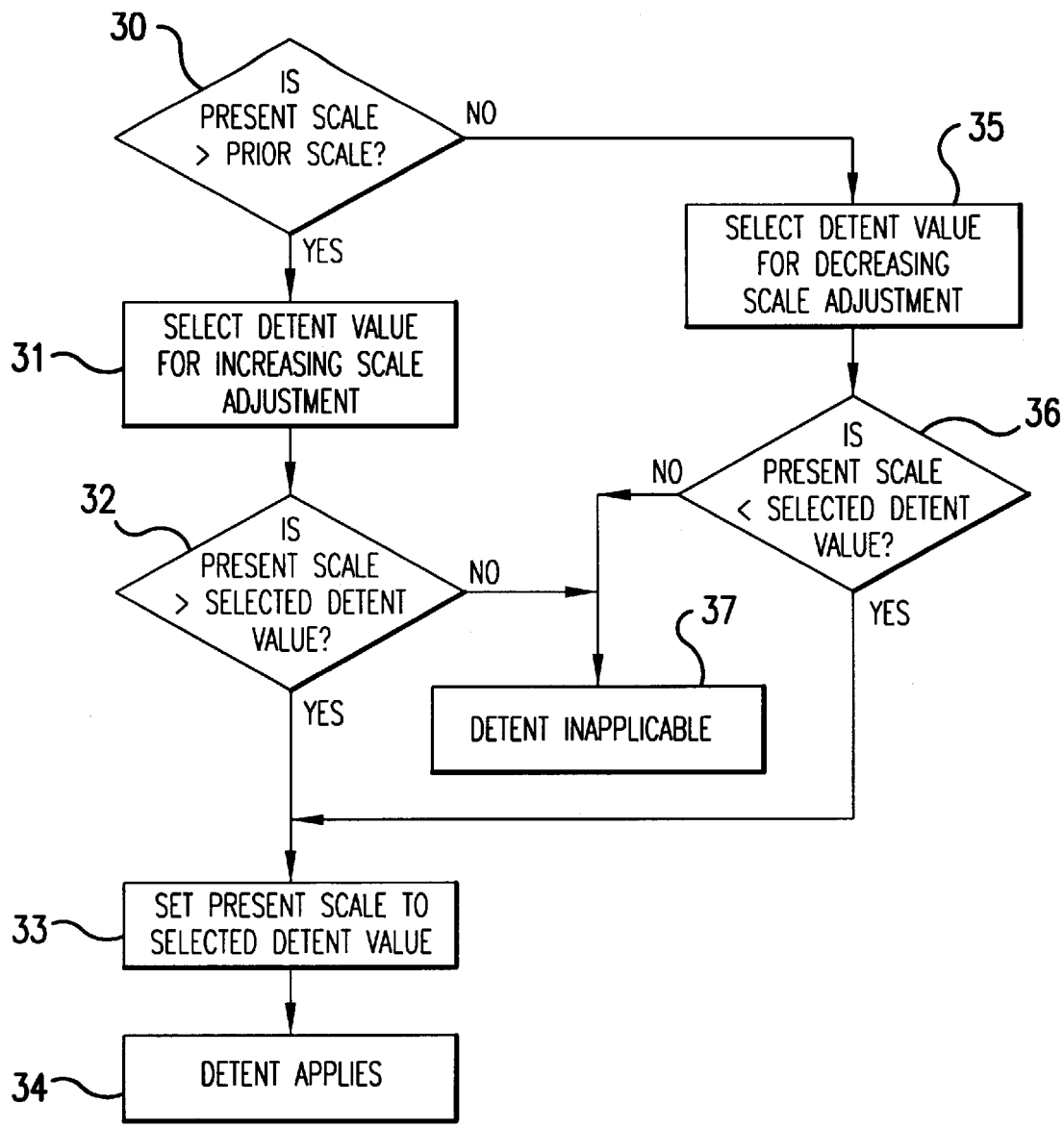
FIG. 2C is a detailed view of a second portion of the flow diagram of FIG. 1.

FIG. 2C is a detailed view of step 6 of the flow diagram of FIG. 1. In step 30 of FIG. 2C, the present scale is compared to the prior scale to determine whether the user input to the input control sensor is designating an increasing scale adjustment or a decreasing scale adjustment. When the present scale is greater than the prior scale, the user input to the control sensor is in the direction of an increasing adjustment to the scale parameter and step 31 follows step 30. In step 31, a detent value is selected from a series of detent values based on the prior scale. The selected detent value is the next higher detent value in the series of detent values that is above the prior scale. For example, in an oscilloscope having a series of amplitude detent values of 1mV, 2mV, 5mV and then 10mV, 20mV, 50mV and so on, when the prior scale is 4mV, the selected detent value is the next higher detent value in the series that is above 4mV. In this example, the selected detent value would be 5mV.

In step 32, the present scale is compared to the selected detent value to determine whether the present scale is greater than the selected detent value. If the present scale is greater than the selected detent value, then the present scale is set to the selected detent value in step 33, and step 34 indicates that the detent applies. When step 32 indicates that the present scale is not greater than the selected detent value, the detent is inapplicable as indicated in step 37 and the present scale is not set to the detent value selected in step 31. The present scale, under these conditions, remains equal to that present scale established in step 5 of the flow diagram of FIG. 1.

Referring again to step 30 in FIG. 2C, when the present scale is not greater than the prior scale, the user input to the control sensor is in the direction of a decreasing adjustment to the scale parameter and step 35 follows step 30. In step 35, a detent value is selected from the series of detent values based on the prior scale. The selected detent value is the next lower detent value in the series of detent values that is below the prior scale. In the oscilloscope example, where there is a series of amplitude detent values of 1mV, 2mV, 5mV, and 10mV, 20mV, 50mV and so on, when the prior scale is 4mV, the selected detent value is the next lower detent value in the series that is below 4mV. In this example, the selected detent value would be 2mV.

In step 36, the present scale is compared to the selected detent value. If the present scale is less than the selected detent value, the present scale is set to the selected detent value in step 33 and step 34 indicates that the detent applies. When step 36 indicates that the present scale is not less than the selected detent value, the detent is inapplicable, as indicated in step 37.

Step 30 through step 37 of FIG. 2C show the detailed view of step 7 of FIG. 1, and establish whether or not the detent is applicable. In FIG. 1, under condition that the detent is determined in step 7 to be applicable, a detent timer is enabled and the detent timer starts running and continues to run for a predefined time interval. The scale parameter in the instrument is set to the present scale, which had been set to the selected detent value in step 33 of FIG. 2C. The effect of an applicable detent in step 7 is that the detent value is held for the interval of time that the detent timer runs, even when user inputs to the input control sensor are detected in step 1. (Step 1 through step 3 show that events generated by the input control sensor are not processed to control instrument scale parameters while the detent timer is running). The time interval is chosen so that the scale parameter dwells at the selected detent value for some amount of time, for example, several hundred milliseconds, even if the control sensor continues to be stimulated (for example, if the RPG continues to be rotated by a user of the instrument).

The scale parameter is adjusted to the present scale in step 9. When step 7 indicates that the detent is not applicable, the present scale is not set to the selected detent value as it is when the detent is applicable. Rather, the present scale is that as determined in step 5—based on the prior scale, the predefined step size and the acceleration factor. The prior scale is updated in step 10 and the flow diagram loops back to step 1 to detect additional user inputs to the input control sensor.

Step 7 through step 9 provide convenient control of scale parameters according to the series of detent values under the condition that the detent is applicable. For example, when the user repeatedly stimulates the input control sensor so that the detent is repeatedly applicable, for example, by rotating the knob of an RPG with repeated, quick twists, the scale parameter will step through the scale adjustment range in defined scale adjustment steps that are equal to the detent values. At each of the steps, the scale parameter dwells at the detent value for at least as long as the predefined time interval during which the detent timer runs.

While the preferred embodiment of the present invention has been illustrated in detail, it should be apparent that modifications and adaptations to this embodiment may occur to one skilled in the art without departing from the scope of the present invention as set forth in the following claims.

What is claimed is:

1. A method for adjusting a scale parameter in an instrument having an event-generating sensor responsive to a user input, comprising:

determining an acceleration factor based on events generated by the sensor;

modifying a scale step size, that has a predefined correspondence to the events generated by the sensor, by the acceleration factor;

establishing a present scale by adding the scale step size as modified by the acceleration factor to a prior scale;

selecting a detent value from a series of detent values based on the prior scale and the present scale;

setting the present scale to the selected detent value when the present scale is greater than the prior scale and is greater than the selected detent value and setting the present scale to the selected detent value when the present scale is less than the prior scale and is less than the selected detent value;

adjusting the scale parameter in the instrument to the present scale; and maintaining the scale parameter at the present scale for at least a predetermined time interval under condition that the present scale is set to the selected detent value.

2. The method of claim 1 wherein the selected detent value is a first detent value in the series of detent values that is less than the prior scale when the present scale is less than the prior scale.

3. The method of claim 1 wherein modifying a scale step size includes multiplying the scale step size by the determined acceleration factor.

4. The method of claim 3 wherein the minimum factor and the first quantity are designated so that adjusting the scale parameter in the instrument provides fine control of the scale parameter when the step size is modified by the acceleration factor designated to be the minimum factor.

5. The method of claim 3 wherein the maximum factor and the second quantity are designated so that adjusting the scale parameter in the instrument provides control of the scale parameter not exceeding a maximum sensitivity when the step size is modified by the maximum factor.

6. The method of claim 1 wherein modifying a scale step size includes multiplying the scale step size by the determined acceleration factor.

7. The method of claim 6 wherein the minimum factor and the first quantity are designated so that adjusting the scale parameter in the instrument provides fine control of the scale parameter when the step size is modified by the acceleration factor designated to be the minimum factor.

8. The method of claim 6 wherein the maximum factor and the second quantity are designated so that adjusting the scale parameter in the instrument provides control of the scale parameter not exceeding a maximum sensitivity when the step size is modified by the maximum factor.

9. The method of claim 1 wherein the series of detent values contains multiple detent values in a one-two-five sequence.

10. The method of claim 9 wherein the selected detent value is a first detent value in the series of detent values that is less than the prior scale when the present scale is less than the prior scale.

11. The method of claim 9 wherein the selected detent value is a first detent value in the series of detent values that is greater than the prior scale when the present scale is greater than the prior scale.

12. The method of claim 11 wherein the selected detent value is a first detent value in the series of detent values that is less than the prior scale when the present scale is less than the prior scale.

13. The method of claim 1 wherein the selected detent value is a first detent value in the series of detent values that is greater than the prior scale when the present scale is greater than the prior scale.

14. The method of claim 13 wherein the selected detent value is a first detent value in the series of detent values that is less than the prior scale when the present scale is less than the prior scale.

15. The method of claim 1 wherein determining an acceleration factor includes determining the number of events generated by the sensor per unit of time, designating the acceleration factor to be a minimum factor when the number is less than a first quantity, designating the acceleration factor to be a maximum factor when the number exceeds a second quantity greater than the first quantity, and designating the acceleration factor to have a monotonic relationship to the number when the number is between the first quantity and the second quantity.

16. The method of claim 15 wherein the maximum factor and the second quantity are designated so that adjusting the scale parameter in the instrument provides control of the scale parameter not exceeding a maximum sensitivity when the step size is modified by the maximum factor.

17. The method of claim 15 wherein the minimum factor and the first quantity are designated so that adjusting the scale parameter in the instrument provides fine control of the scale parameter when the step size is modified by the acceleration factor designated to be the minimum factor.

18. The method of claim 17 wherein the maximum factor and the second quantity are designated so that adjusting the scale parameter in the instrument provides control of the scale parameter not exceeding a maximum sensitivity when the step size is modified by the maximum factor.

* * * * *